United States Patent
Van Santen et al.

(10) Patent No.: US 7,399,978 B2
(45) Date of Patent: Jul. 15, 2008

(54) METHOD AND DEVICE FOR IRRADIATING SPOTS ON A LAYER

(75) Inventors: Helmar Van Santen, Eindhoven (NL); Jacobus Hermanus Maria Neijzen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 457 days.

(21) Appl. No.: 10/539,351

(22) PCT Filed: Nov. 20, 2003

(86) PCT No.: PCT/IB03/05708

§ 371 (c)(1),
(2), (4) Date: Jun. 15, 2005

(87) PCT Pub. No.: WO2004/057590

PCT Pub. Date: Jul. 8, 2004

(65) Prior Publication Data

US 2006/0209414 A1    Sep. 21, 2006

(30) Foreign Application Priority Data

Dec. 19, 2002 (EP) .................................. 02080376

(51) Int. Cl.
*G21G 5/00* (2006.01)
*G03B 27/52* (2006.01)
*G03B 27/42* (2006.01)
*G03C 5/00* (2006.01)

(52) U.S. Cl. ................... 250/492.1; 355/30; 355/53; 430/269; 430/311

(58) Field of Classification Search .............. 355/30, 355/53, 72, 77; 430/269, 311; 250/216, 250/234, 235, 492.1
See application file for complete search history.

(56) References Cited

U.S. PATENT DOCUMENTS

| 4,480,910 A | 11/1984 | Takanashi et al. |
| 6,236,634 B1 | 5/2001 | Lee et al. |
| 2002/0020821 A1* | 2/2002 | Van Santen et al. ...... 250/492.2 |

FOREIGN PATENT DOCUMENTS

DE      221 563 A1 *   4/1985

(Continued)

OTHER PUBLICATIONS

English Translation of WO 99/49504 (dated Sep. 30, 1999).*

(Continued)

*Primary Examiner*—Alan A Mathews
(74) *Attorney, Agent, or Firm*—Michael E. Belk

(57) ABSTRACT

For irradiating a layer a radiation beam is directed and focussed to a spot on the layer, relative movement of the layer relative to the optical element is caused so that, successively, different portions of the layer are irradiated and an interspace between a surface of the optical element nearest to the layer is maintained. Furthermore, at least a portion of the interspace through which the radiation irradiates the spot on the layer is maintained filled with a liquid, the liquid being supplied via a supply conduit and flowing out of an outflow opening through a total projected cross-sectional passage area in a plane parallel to the layer. The outflow opening or a plurality of the outflow openings are positioned such that, seen in a direction perpendicular to the layer, the total cross-sectional area has a centre in the portion of the interspace through which the radiation irradiates the spot.

8 Claims, 4 Drawing Sheets

FOREIGN PATENT DOCUMENTS

| | | | |
|---|---|---|---|
| JP | 6-124873 | * | 5/1994 |
| JP | 10255319 A | | 9/1998 |
| WO | 9949504 A1 | | 9/1999 |
| WO | 0213194 A1 | | 2/2002 |

OTHER PUBLICATIONS

English Translation of JP 6-124873 (dated May 6, 1994).*
English Translation of JP 10-255319 (dated Sep. 25, 1998).*
English Translation of DD 221 563 A1 (dated Apr. 24, 1985).*
ISR Publication, International Publication No. WO2004/027590A1.

* cited by examiner

METHOD AND DEVICE FOR IRRADIATING SPOTS ON A LAYER

The invention relates to a method of irradiating a layer and to a device for irradiating a layer.

Such a method and such a device are known from WO-A-02/13194. According to this publication, the described method and device are used for the manufacturing of an optically scannable information carrier. In such a process, first a master mold is manufactured, and then, by means of the master mold or by means of a daughter mold manufactured by means of the master mold, the information carrier is manufactured by means of a replica process. For manufacturing the master mold, a modulated radiation beam which is directed and focussed to a scanning spot on a photosensitive layer carried by a substrate by means of an optical lens system and the substrate and the lens system are moved relatively to each other. An interspace between the photosensitive layer and a nearest surface of a lens system facing the photosensitive layer is maintained filled up with a liquid.

For moving the substrate relative to the lens system a table carrying the substrate can be rotated about an axis of rotation. By means of a displacement device, the lens system can be displaced with a radial directional component with respect to the axis of rotation of the table. A liquid supply means supplies the liquid into the interspace between the photosensitive layer and a nearest optical surface of the lens system.

A problem of this known method and device is that the immersion of the successive portions of the layer to be irradiated is quite easily disrupted, for instance because the liquid is entrained away from the area of the interspace through which the radiation directed to the radiation spot passes when the layer and the lens move too quickly relative to each other. The immersion can also be disrupted due to important changes in the direction of movement of the lens and the layer relative to each other. The stability of the liquid film between the layer to be irradiated and the nearest optical surface of the optical element can be improved by making the distance between the layer to be irradiated and the nearest optical surface of the optical element very small. However, this entails that the device and in particular the lens nearest to the layer to be irradiated can easily be damaged in the event of contact between the lens and the layer moving relative to each other.

Another method and device for directing a radiation beam to a spot on a photosensitive layer are disclosed in JP-A-10255319. In accordance with this method, a photosensitive layer is applied to a disc-shaped substrate made from glass. The table and the substrate are rotated about an axis of rotation extending perpendicularly to the substrate, and the lens system is displaced, at a comparatively low rate, in a radial direction with respect to the axis of rotation, so that the scanning spot of the radiation beam formed on the photosensitive layer follows a spiral-shaped track on the photosensitive layer. The radiation beam—in this known device a laser beam—is modulated such that a series of irradiated and non-irradiated elements is formed on the spiral-shaped track, which series correspond to a desired series of information elements on the information carrier to be manufactured. The photosensitive layer is subsequently developed, so that the irradiated elements are dissolved and a series of depressions are formed in the photosensitive layer. Next, a comparatively thin aluminum layer is sputtered onto the photosensitive layer, which aluminum layer is subsequently provided with a comparatively thick nickel layer by means of an electro deposition process. The nickel layer thus formed is subsequently removed from the substrate and forms the master mold to be manufactured, which is provided, in the manner described above, with a disc-shaped surface having a series of raised portions corresponding to the desired series of information elements on the information carrier to be manufactured. The master mold thus manufactured can suitably be used in the manufacture of the desired information carriers, however, in general, a number of copies, so-called daughter molds are made by means of the master mold in a replica process. These daughter moulds are used to manufacture the desired information carriers by means of a further replica process, generally an injection molding process. In this manner, the required number of master molds, which are comparatively expensive, is limited. Such a method of manufacturing an optically scannable information carrier, such as a CD or DVD, having pit-shaped information elements by means of a master mold or by means of a daughter mold manufactured by means of the master mold is commonly known and customary.

The interspace between the photosensitive layer and the lens of the lens system facing the photosensitive layer is filled with water. For this purpose, the known device is provided with an outflow opening, which is situated near the axis of rotation of the table. The water supplied via the outflow opening is spread, under the influence of centrifugal forces, substantially throughout the surface of the photosensitive layer, so that also the interspace is filled with water. Since water has a considerably larger optical refractive index than air, the provision of water in the interspace leads to a substantial increase of an angle which the rays originating from the radiation beam and the optical axis of the lens system include at the location of the scanning spot. As a result, the size of the spot formed by the radiation beam on the photosensitive layer is reduced considerably, so that a much larger number of irradiated and non-irradiated elements can be formed on the photosensitive layer, and the information carrier to be manufactured has a higher information density.

Another example of an application in which the gap between a lens and a surface to be irradiated is maintained filled with a liquid are optical imaging methods and apparatus, such as optical projection lithograpy, in which the spot formed by the radiation projected onto the surface forms an image or a partial image. Such a method and apparatus are described in international patent application WO99/49504.

A drawback of these methods and devices is that the liquid film formed in the interspace is not always reliably maintained fully and in homogenous condition during and after relative displacement of the lens and the surface parallel to the surface. As a result, faults develop in the photosensitive layer. In addition, variations in the condition of the liquid film caused by relative movements of the lens and the surface result in varying forces being exerted on the lens system. Since the lens system is suspended with a limited rigidity, the varying forces exerted by the liquid film cause undesirable vibrations of the lens system, which further disturb the precision with which the image is projected onto the surface. Furthermore, a comparatively large quantity of liquid must be supplied to keep a liquid volume in place in the portion of the interspace through which the radiation passes. As a result, the known device must be provided with extensive measures to prevent undesirable contact between the liquid and other parts of the device.

It is an object of this invention to reliably maintain the portion of the interspace between the optical surface nearest to the layer to be irradiated and that layer through which the radiation passes filled with liquid throughout a larger range of relative velocities and directions of relative displacement of the optical element and the layer.

It is another object of the invention to reduce the risk of damage due to unintentional contact between the optical element and the layer to be irradiated.

The canal distributing supplied liquid longitudinally along the canal and dispensing distributed liquid towards the layer feeds the liquid as a layer. Accordingly, the portion of the interspace fulfilling an optical function can be maintained filled with liquid with less sensitivity to variations in direction and velocity of the movement of the lens or lenses and the layer relative to each other.

That the method and the device are less sensitive to the velocity and direction of displacement of the optical element and the layer relative to each other and variations therein, is not only advantageous in the manufacturing of optical information carriers or molds therefor in which there are at most quite small variations in the direction of movement of the layer relative to the optical element, but also in other applications, such as optical imaging, and more in particular in for instance wafer steppers and wafer scanners for optical projection lithography for example for the production of semiconductor devices in which the direction of movement of the optical element relative to the layer is varied substantially when the wafer is stepped relative to the optical element to bring the optical element into a new position opposite the wafer for projecting the reticle onto a new spot on the wafer or for unrolling (scanning) the projected image of the reticle (mask) over a next area on the wafer. The spot is then formed either by the area of projection of the reticle onto the wafer or by the moving area of projection of a running, usually slit shaped, window portion of the reticle obtained by or as if scanning along the reticle in accordance with movement of the wafer relative to the optical element.

Other objects, features and effects as well as details of this invention appear from the detailed description of a preferred form of the invention.

Figure 1:
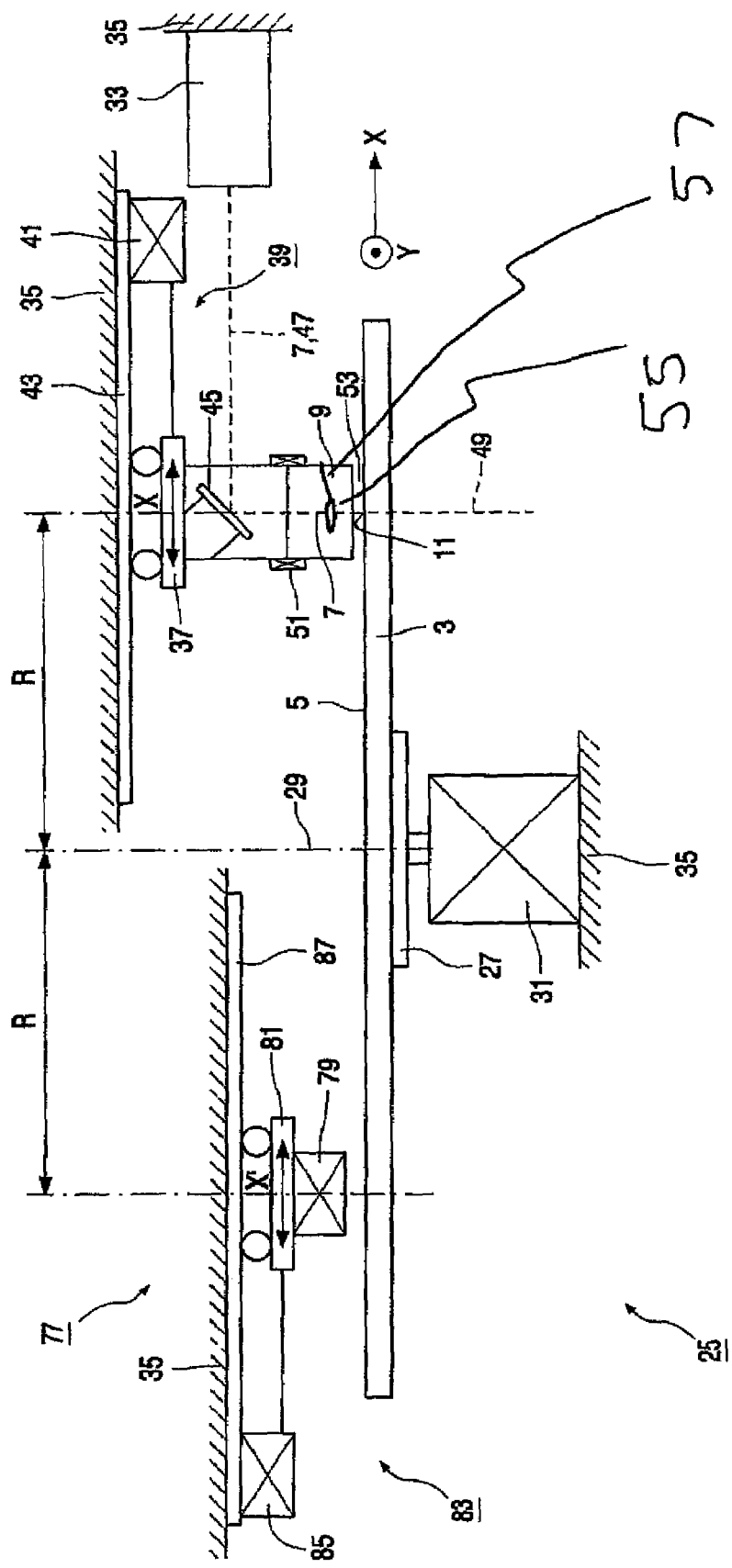
FIG. 1 is a schematic side view of an example of a device for directing radiation to a spot on a layer.

In the manufacture of an optically scannable information carrier, such as a CD or a DVD, a disc-shaped substrate 3 of glass (see FIG. 1) carrying a thin photosensitive layer 5 on one of its two sides is irradiated by means of a modulated radiation beam 7, for instance a DUV laser beam with a wavelength of approximately 260 nm. To irradiate the photosensitive layer 5, use is made of an example 25 of a device in accordance with the invention, which device is described hereinafter with reference to FIGS. 1-3. The radiation beam 7 is focused to a scanning spot 11 on the photosensitive layer 5 by an optical system, according to the present example in the form of a lens system 9, including a plurality of optical elements in the form of lenses. The lens system 9 includes an objective lens 55, which is secured in a lens holder 57. The lens system 9 further includes a most distal lens 59, which is the one of the optical elements of the lens system 9 that is located nearest to the layer 5 when in operation. An interspace 53 is maintained between the layer 5 that is irradiated and the one of the optical elements of the lens system 9 that is located nearest to the layer 5. The optical elements may also include other items than lenses, such as filters, shields, diffraction gratings or mirrors.

The layer 5 and the lens system 9 are displaced with respect to each other, so that the modulated radiation beam 7 on the photosensitive layer 5 successively irradiates a series of spaced apart irradiated portions of the layer 5 and does not irradiate portions of the layer 5 in-between the irradiated portions. The irradiated photosensitive layer 5 is subsequently developed by means of a developing liquid, which dissolves the irradiated elements 13 and leaves the non-irradiated elements 15 on the substrate 3. It is also possible to provide that the irradiated portions are left while the non-irradiated portions are dissolved. In both cases, a series of pits or bumps, which corresponds to the desired series of pit-shaped information elements on the information carrier, are formed in the photosensitive layer 5. The photosensitive layer 5 is subsequently covered with a comparatively thin layer of for instance nickel by means of a sputtering process. Subsequently, this thin layer is covered with a comparatively thick nickel layer in an electro deposition process. In the nickel layer, which is eventually removed from the substrate 3, the pattern of pits formed in the photosensitive layer 5 leaves a corresponding pattern that is a negative of the pattern to be formed in the information carrier to be manufactured, i.e. the master mold comprises a series of raised portions, which correspond to the series of pit-shaped elements formed in the photosensitive layer 5 and to the desired series of pit-shaped information elements on the information carrier. The master mold is thus rendered suitable for use as a mold in an injection-molding machine for injection molding the desired information carriers. Generally, however, a copy of the master mold is used as the mold for injection molding instead of the master mold, which copy of the master mold is commonly referred to as daughter mold, which is manufactured by means of the master mold using a customary replica process which is known per se.

The substrate 3 with the photosensitive layer 5 is placed on a table 27 that is rotatable about an axis of rotation 29, which extends perpendicularly to the table 27 and the substrate 3. The table can be driven by means of a first electromotor 31. The device 25 further comprises a radiation source 33, which, in the example shown, is a laser source, which is secured in a fixed position to a frame 35 of the device 25. It is observed that, as an alternative, the radiation may also be obtained from outside the device. Control over the radiation directed to the layer 5 can be achieved in many ways, for instance by controlling the radiation source 33 and/or by controlling a shutter or radiation diverter (not shown) between the radiation source 33 and the layer 5.

The optical lens system 9 is secured onto a first traveller 37, which can be displaced radially (parallel to the X-direction in the drawings) relative to the axis of rotation 29, by means of a first displacement structure 39. For this purpose, the first displacement structure 39 includes a second electromotor 41 by means of which the first traveller 37 can be displaced over a straight guide 43, which extends parallel to the X-direction and is fixed relative to the frame 35.

A mirror 45 in line with an optical axis 49 of the lens system 9 is also secured to the first traveller 37. In operation, the radiation beam 7 generated by the radiation source 33 follows a radiation beam path 47 extending parallel to the X-direction, and the radiation beam 7 is deflected by the mirror 45 in a direction parallel to the optical axis 49 of the lens system 9.

The lens system 9 can be displaced in the direction of its optical axis 49 by means of a focus actuator 51, over comparatively small distances with respect to the first traveller 37, so that the radiation beam 7 can be focused on the photosensitive layer 5. The table 27 with the substrate 5 is rotated about the axis of rotation 29 at a comparatively high speed by means of the first motor 31, and the lens system 9 is displaced parallel to the X-direction by means of the second motor 41 at a comparatively low speed, so that the scanning spot 11 where the radiation beam 7 hits the layer follows a spiral-shaped track over the photosensitive layer 5, leaving a trail of irradiated and non-irradiated elements extending in accordance with this spiral-shaped track.

The device 25 can suitably be used to manufacture master molds having a comparatively high information density, i.e. by means of the device 25, a comparatively large number of irradiated elements can be provided per unit area of the photosensitive layer 5. The attainable information density increases as the scanning spot 11 is smaller. The size of the scanning spot 11 is determined by the wavelength of the radiation beam 7 and by the numerical aperture of the lens system 9, the numerical aperture depending upon the optical refractive index of the medium present between the lens system 9 and the photosensitive layer 5. The scanning spot 11 is smaller as the refractive index of the medium present between the lens system 9 and the photosensitive layer 5 is larger. Liquids typically have a much larger optical refractive index than air and therefore the portion of the interspace 53 between the lens system 9 and the photosensitive layer 5 through which the beam 7 extends is maintained filled with a liquid—according to this example water. In the present example, water is also particularly suitable because it is transparent to the DUV radiation beam 7 used and it does not attack the photosensitive layer 5.

As shown in FIG. 1, the device 25 according to the present example further includes a liquid removal structure 77, which is provided with a pick-up mouth 79. The pick-up mouth 79 is secured onto a second traveller 81 of the device 25, which can be displaced by means of a second displacement structure 83 of the device 25 in a radial direction with respect to the axis of rotation 29, according to the present example parallel to the X-direction, but another radial direction of displacement may be provided. For driving the displacement of the second traveller 81, the second displacement device 83 comprises a third electromotor 85 connected to the second traveller 81 for displacing the second traveller over a straight guide 87, which is attached to the frame 35 and extends in the directions of displacement of the second traveller 81.

In operation, the pick-up mouth 79 is displaced by means of the third motor 85. The third motor 85 is controlled so that the lens system 9 and the pick-up mouth 79 are continuously situated at substantially equal distances R from the axis of rotation 29 of the substrate 3. In this manner, the pick-up mouth 79 is maintained in a position downstream from the lens system 9 where irradiated portions of the layer 5 pass, so that the liquid supplied at the location of the lens system 9 is entrained by the rotating layer 5 to the pick-up mouth 79 where the liquid is subsequently picked-up from the photosensitive layer 5 by the pick-up mouth 79. As the water is thus removed from the photosensitive layer 5 downstream from the lens system 9, it is substantially precluded that water that has already been used finds its way back to the interspace 53, thereby disturbing the accurately dosed liquid flow in the interspace 53. In operation, the pick-up mouth 79 is always at a distance R from the axis of rotation 29 which corresponds to the distance R at which the lens system 9 is situated from the axis of rotation 29, both the size and the capacity of the pick-up mouth 79 need only to be comparatively small to remove liquid that has already been used.

Figure 2:
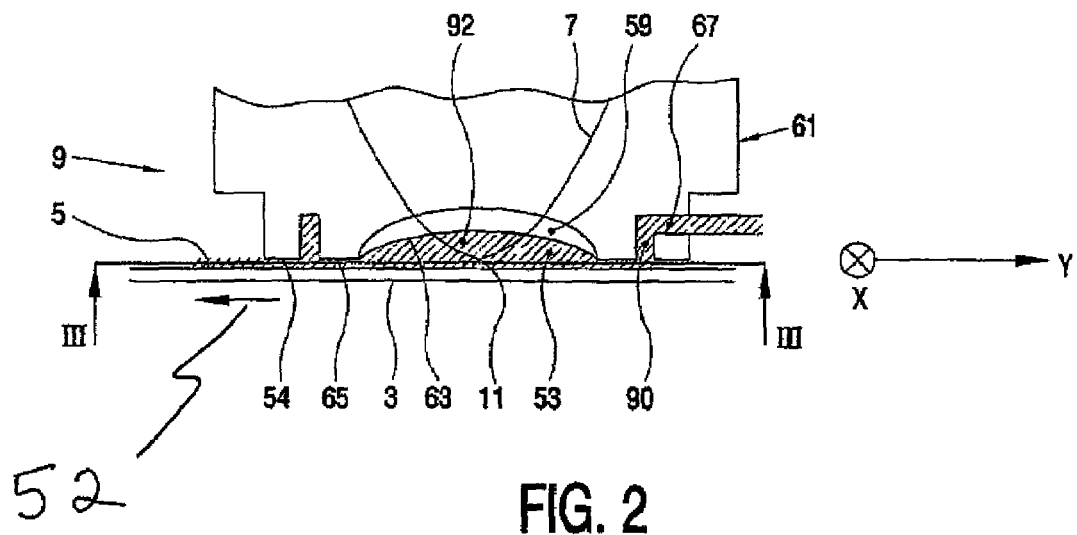
FIG. 2 is a schematic, cross-sectional view of a distal end portion of a first example of an optical system for a device as shown in FIG. 1, of a layer to which the radiation is directed and of a liquid flow maintained in operation.
Figure 3:
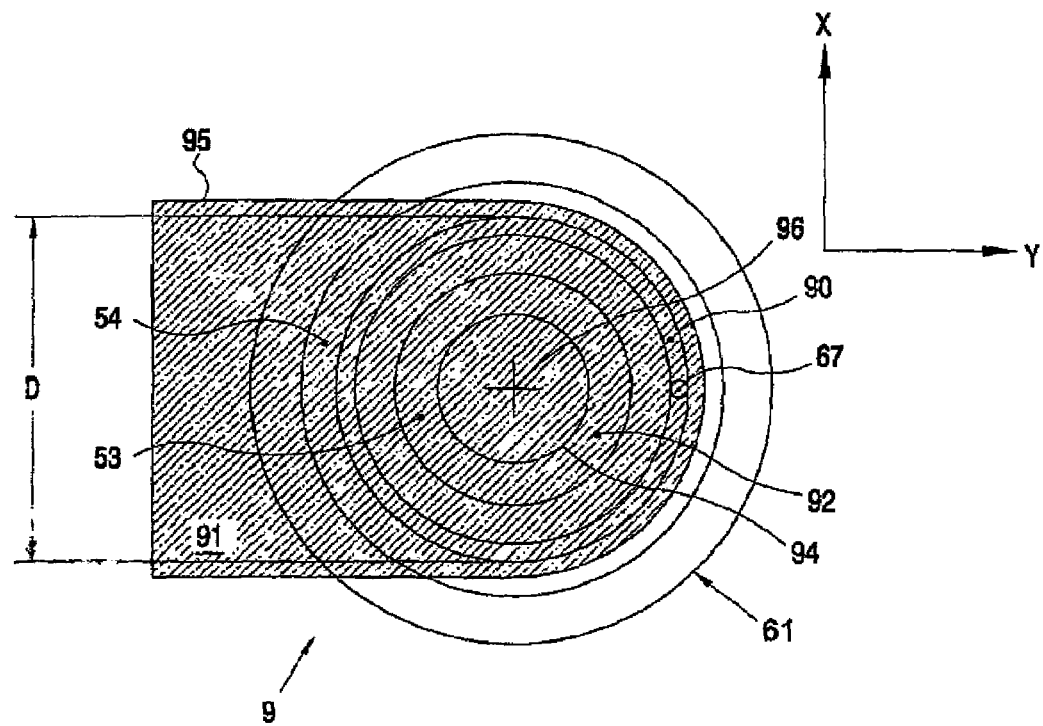
FIG. 3 is a schematic, bottom view along the line III-III in FIG. 2

FIGS. 2 and 3 show, in more detail, the lens system 9, the substrate 3 with the photosensitive layer 5, and the interspace 53 between the photosensitive layer 5 and the lens system 9. The lens 59 nearest to the layer 5 has an optical surface 63 facing the substrate 3 and nearest to the substrate 3. The lenses 55, 59 are suspended in a housing 61, which includes a flat wall 65, which faces the layer 5 and which substantially extends in an imaginary plane perpendicular to the optical axis of the lens 59 nearest to the layer 5. In the surface of the lens system nearest to the layer 5, a recess 92 facing the spot 11 to which the radiation 7 is directed is provided. The surface 63 of the lens 59 nearest to the layer 5 forms an internal surface of the recess 92. This surface 63 also bounds the portion of the interspace 53 through which the radiation 7 irradiates the spot 11. According to the present example, the surface 63 of the lens 59 nearest to the layer 5 is concave so that the deepest point of the recess 92 is in the middle, however, this surface may also be flat or convex.

In operation, the portion of the interspace 53 through which the radiation 7 irradiates the spot 11 on the layer 5 is maintained filled with liquid 91. In the recess 92, the liquid 91 is, at least to some extent, protected against being entrained from the interspace 53. Since, the liquid 91 is less susceptible to being entrained away from the portion of the interspace 53 through which the radiation passes to the spot 11, occurrence of the associated optical distortion caused by the portion of the interspace 53 through which the radiation passes not being completely filled with liquid is thus counteracted.

Moreover, this allows the smallest size of the interspace 53 measured parallel to the optical axis of the lenses 55, 59 to be relatively large. In turn, this reduces the risk of damage to the lens 59 nearest to the layer 5 and the allowable tolerances on the tilt of the lens can be larger without increasing the risk of the lens 59 touching the layer 5.

The recess 92 may for instance be positioned and of such dimensions, so that only a portion of the radiation passes through the recess. However, for a particularly effective protection of liquid 91 across the whole radiation beam, it is preferred that the recess 92 has a rim portion 94 closest to the layer 5, which extends around the radiation 7 irradiating the spot 11. Accordingly, the portion of the interspace 53 in the recess 92 in which liquid 91 is shielded from being entrained extends throughout the whole cross-section of the radiation beam.

The optimum working distance between the layer 5 and the wall 65, i.e. the portion of the lens assembly nearest to the layer 5, is determined by two factors. On the one hand, the distance should be large enough to retain sufficient tolerance on the distance between the substrate 3 and arrangement of the lenses 55, 59 and the housing 61. On the other hand, this distance should not be too large because this would require a too large liquid flow to maintain the immersed condition of the portion of the interspace 53 through which the radiation passes to the spot 11. A presently preferred range for the smallest thickness of the interspace 53 is 3-1500 μm and more preferably 3-500 μm if the liquid is water larger values for the smallest thickness of the interspace can be particularly advantageous if the liquid has a larger viscosity than water. Also the overall width of the outflow opening affects the upper end of the preferred range for the smallest thickness of the interspace, the smallest thickness of the interspace being preferably smaller than $(100+\frac{1}{20}*W)$ μm in which W is the overall width of the outflow opening measured in a plane parallel to the layer 5.

The smallest thickness of the interspace may be larger than approximately 10 µm, for instance larger than 15 µm, 30 µm or even 100 µm, to increase the insensitivity to tolerances.

To avoid inclusion of air bubbles in the liquid and for reliably maintaining the filled condition of the portion of the interspace 53 through which the radiation 7 passes to the spot 11, liquid outflow is preferably such that a liquid volume between the wall 65 and the layer 5 is maintained which includes a portion of the interspace 53 upstream (in a direction opposite to the direction of relative movement of the layer 5 in the area of the spot 11) of the portion of the interspace 53 through which the radiation irradiates the spot 11. Thus, a safety margin of liquid upstream is formed which ensures that variations in the distance over which liquid is urged in upstream direction do not cause a disruption of the filled condition of the portion of the interspace 53 through which the radiation 7 passes to the spot 11.

The most downstream outflow opening 90 in the lens system 9 through which the liquid 91 is passed has a total projected cross-sectional passage area in a plane parallel to the layer 5 of which, seen in a direction parallel to the optical axis of the lens system 109, the centre is located inside the portion of the interspace 53 through which the radiation 7 irradiates the spot 11. Accordingly, the average path along which liquid flows out is at least to a large extent centred relative to the portion of the interspace 53 through which radiation passes to the spot 11. Accordingly, the direction of movement of the layer 5 and the lens arrangement 9 relative to each other in the area of the spot 11 can be varied substantially without disrupting complete immersion of the portion of the interspace 53 through which the spot 11 is irradiated. Even if the direction of movement of the layer 5 is varied substantially, the trace of liquid 95 will still cover the entire portion of the interspace 53 through which the spot is irradiated. Nevertheless, areas of the outflow opening 90 around the beam 7 are located close to the beam, so that superfluous wetting of the layer 5 is limited.

According to the present example, the portion of the interspace 53 through which the radiation 7 irradiates the spot 11 is also centrally located relative to the outflow opening 90 to such an extent that the trace 95 of liquid 91 fed from the outflow opening 90 into the interspace 53 completely immerses the portion of the interspace 53 through which the radiation 7 irradiates the spot 11, not only while, in the position of the spot 11, the layer 5 and the at least one lens system 9 move relative to each other in the direction indicated by the arrow 52 (which indicates the direction of movement of the layer 5 relative to the lens system 9), but also while, in the position of the spot 11, the layer 5 and lens system 9 move relative to each other in opposite direction.

The more the direction of movement of the layer 5 and the lens system 9 parallel to the layer 5 in the area of the spot 11 can be changed without disrupting the immersion of the portion 194 of the area 153 through which the radiation passes, the more the device is suitable for applications in which the spot 11 needs to move over the surface of the layer in widely varying directions, such as in imaging processes in which the spot is a two-dimensional image projected to the layer 5. In such applications, the advantage of a comparatively large refractive index between the lens system and the medium between the lens system and the irradiated surface is that the image can be projected with a higher resolution, which in turn allows further miniaturization and/or an improved reliability.

Figure 6:
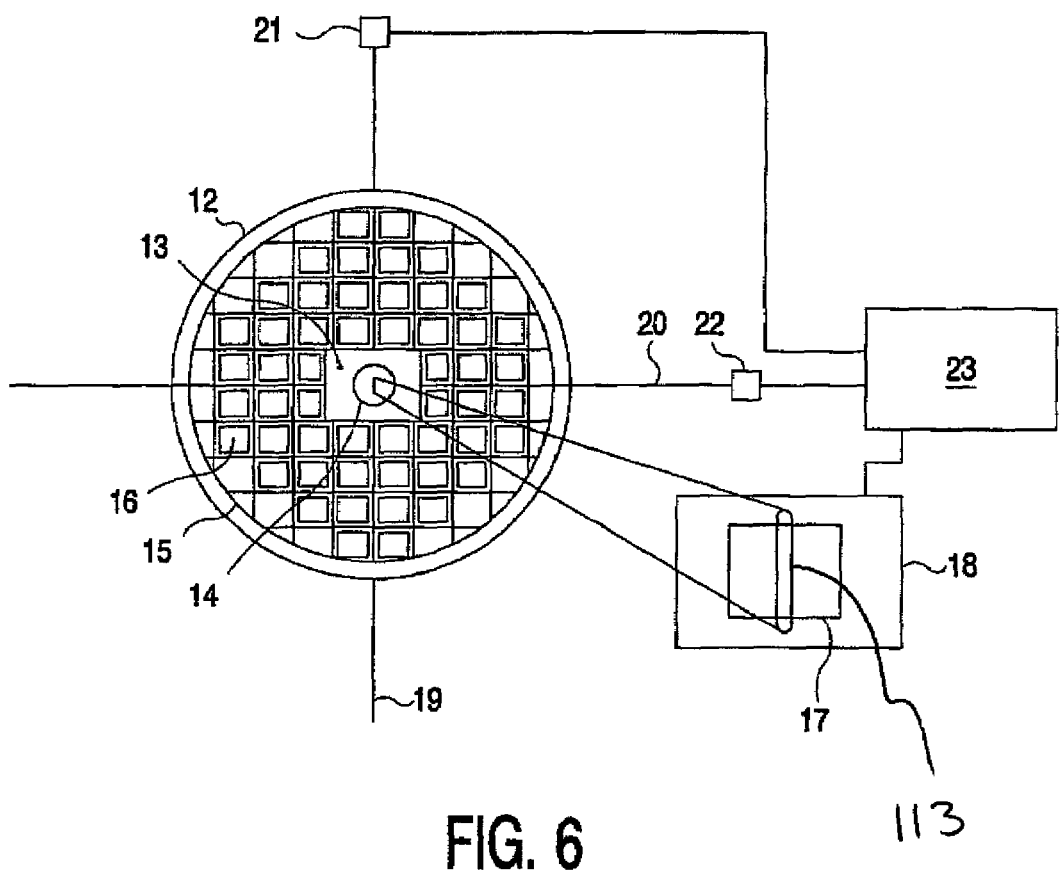
FIG. 6 is a schematic top plan view representation of a wafer stepper/scanner for optical lithography.

An example of such applications is optical projection lithography for the processing of wafers for the manufacture of semiconductor devices. An apparatus and a method for this purpose are schematically illustrated in FIG. 6. Wafer steppers and wafer scanners are commercially available. Accordingly, such methods and apparatus are not described in great detail, but primarily to provide an understanding of liquid immersion as proposed in the present application in the context of such optical imaging applications.

The projection lithography apparatus according to FIG. 6 includes a wafer support 12 and a projector 113 having a lens assembly 14 above the wafer support 12. In FIG. 6, the wafer support 12 carries a wafer 15 on which a plurality of areas 16 are intended to be irradiated by a beam projecting an image or partial image of a mask or reticle 17 in a scanner 18 operatively connected to the projector 113. The support table is moveable in X and Y direction along spindles 19, 20 driven by spindle drives 21, 22. The spindle drives 21, 22 and the scanner 18 are connected to a control unit 23.

Usually one of two principles of operation are applied in optical lithography. In the so-called wafer stepper mode, the projector projects a complete image of the reticle onto one of the areas 16 on the wafer 15. When the required exposure time has been reached, the light beam is switched off or obscured and the wafer 15 is moved by the spindle drives 21, 22 until a next area 16 of the wafer is in the required position in front of the lens assembly 14. Dependent on the relative positions of the exposed area and the next area to be exposed, this may involve relatively quick movement of the lens assembly 14 along the surface of the wafer in widely varying directions. The size of the irradiated spot on the surface of the wafer in which the image of the reticle is projected is typically about 20×20 mm, but larger and smaller spots are conceivable.

In particular when it is desired to manufacture larger semiconductor units, it is advantageous to project the image in the other mode, usually referred to as the wafer scanner mode. In that mode, only a slit-shaped portion of the reticle is projected as a slit shaped spot having a length that is several (for instance four or more times) times larger than its width in an area 16 on the surface of the wafer 15. A typical size for the spot is for instance 30×5 mm). Then, the reticle 17 to be scanned is moved along the scanning window while the wafer support 12 is synchronously moved relative to the lens assembly 14 under control of the control unit 23 with a velocity adapted so that only the projection spot, but not the scanned partial image portions of the reticle 17 that are projected on the wafer move relative to the wafer 15. Thus, the image of the reticle 17 is transferred to an area 16 of the wafer as successive portions "unroll" as the spot progresses over the wafer. The movement of the wafer 15 relative to the lens assembly 14 while a running window portion of the reticle is projected onto the wafer 15 is usually carried out relatively slowly and usually each time in the same direction. After the complete image of a reticle 17 has been projected onto the wafer 15, the wafer 15 is generally moved much more quickly relative to the lens assembly 14 to bring a next area of the wafer 15 where a next image of the or a reticle 17 is to be projected in front of the lens assembly 14. This movement is carried out in widely varying directions dependent on the relative positions of the exposed area 16 of the wafer 15 and the next area 16 of the wafer 15 to be exposed. To be able to recommence irradiating the surface of the wafer 15 after the displacement of the wafer 15 relative to the lens 14 (i.e. also the lens or the lens and the wafer may be moved), it is advantageous if the liquid volume in the interspace between the lens 14 and the surface of the wafer 15 through which the radiation passes is immediately filled with liquid after completion of that movement, so that the space is reliably immersed before radiation is recommenced.

Also for optical lithography, water can be used, for instance if the radiation is light of a wavelength of 193 nm. However in some circumstances other liquids may be more suitable.

Returning to FIGS. 2 and 3, since the recess 92 is bound by a concave portion of the surface 63 of the lens 59 nearest to the spot 11 on the layer 5 to which the beam of radiation 7 is directed, the advantages of having a recess 92 are combined with a relatively uniform flow pattern throughout the portion 94 of the interspace 53 through which radiation 7 passes to the spot 11. In particular, a uniform pattern of flow velocity gradients in the interspace 53 is obtained. In turn, the relatively uniform flow pattern is advantageous to avoid inducing vibrations and for obtaining a continuous uniform supply of fresh liquid and thereby a uniform, steady liquid temperature. These effects are both advantageous for avoiding optical disturbance of the radiation beam 7.

In FIG. 3, the circle designated by reference numeral 94 indicates the perimeter of the portion of the interspace 53 between the lens 59 and the layer 5 through which the radiation beam 7 passes.

For supplying liquid 91 to the interspace 53 between the lens 59 and the layer 5, a liquid supply conduit 67 extends through the housing 61 and leads to an outflow opening 90. According to the present example, the outflow opening 90 has the form of a canal structure in a surface 54, which canal structure 67 is open towards the layer 5, for distributing supplied liquid 91 longitudinally along the canal 67 and dispensing distributed liquid towards the layer 5. In operation, the liquid 91 is distributed by the canal structure 67 longitudinally along that canal structure and the liquid 91 is dispensed from the canal structure 67 towards the layer 5. This results in a relatively wide liquid trace 95 and full immersion of the portion 94 of the interspace 53 through which the radiation beam 7 passes, even if the direction of movement of the lens system 9 and the layer 5 relative to each other parallel to the plane of the layer 5 is changed substantially.

The canal 67 can have various forms. In the embodiment shown in FIGS. 2 and 3, the canal is formed such that the outflow opening 90 is located outside the radiation beam 7 and extends around the portion 94 of the interspace 53 through which the radiation 7 irradiates the spot 11. The cross 96 indicates the centre, seen in a direction parallel to the optical axis of the lens system 9, of the total cross-sectional passage area of the outflow opening 90.

The liquid 91 is preferably supplied at a pressure drop over the liquid between the canal structure 67 and the environment that is just sufficient to keep portion of the interspace 53 through which the radiation passes reliably immersed. Thus, the amount of water fed to the surface is kept to a minimum.

Furthermore, when the liquid 91 is dispensed via a canal shaped outflow opening 90, the smallest thickness of the interspace 153 (in this example the distance between the layer 5 and the surface 54 of the wall portion 65) may be larger, without causing an undue risk of disrupting the immersion of the portion 94 of the interspace through which the radiation passes. Therefore, when the liquid is dispensed from a canal-shaped outflow opening 90, the displacement structure 39, 83 and the lens system 9 are preferably positioned and dimensioned for maintaining the smallest thickness of the interspace 53 in a range between 3 and 500 µm.

The flow rate with which the liquid 91 is supplied is preferably such that it can be reliably ensured that a laminar flow with an essentially linear velocity profile and preferably a homogeneous Couette flow is present in the interspace 53. Such a flow exerts a substantially constant force on the wall 65 in which the canal 67 is provided and on the side 63 of the lens 59 nearest to the layer 5. As a result, the liquid present in the interspace 53 exerts substantially no variable liquid forces on the lens system 9. Such varying liquid forces would lead to undesirable vibrations of the lens system 9 and hence to focusing errors and positioning errors of the radiation beam 7 on the photosensitive layer 5. The flow is preferably free of air inclusions, so that the radiation beam 7 is not disturbed.

Figure 4:
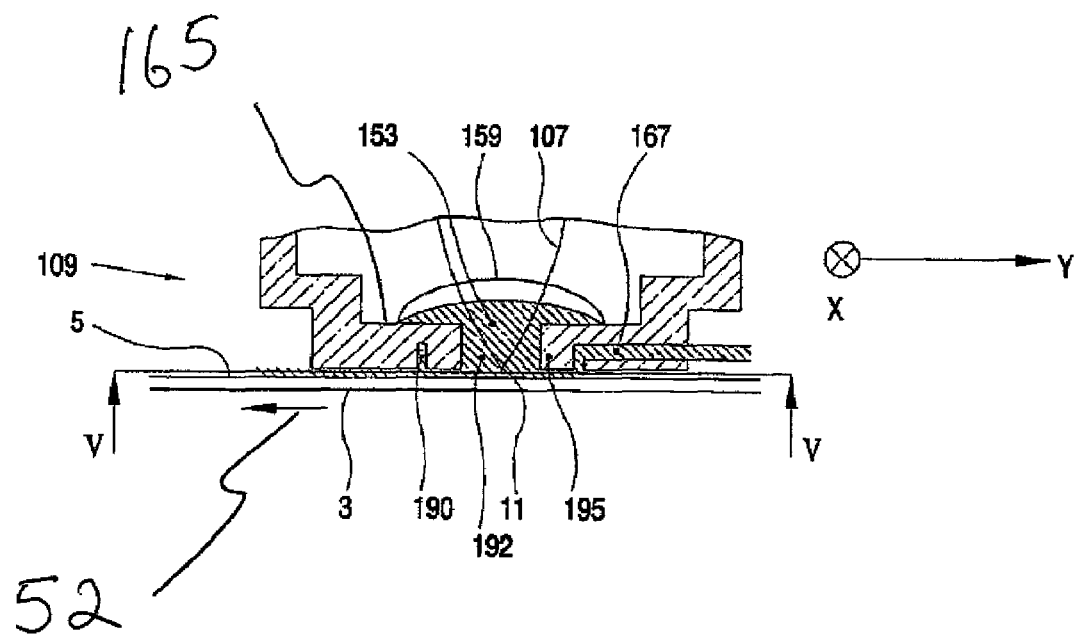
FIG. 4 is a schematic, cross-sectional view of a distal end portion of a third example of an optical system for a device as shown in FIG. 1, of a layer to which the radiation is directed and of a liquid flow maintained in operation.
Figure 5:
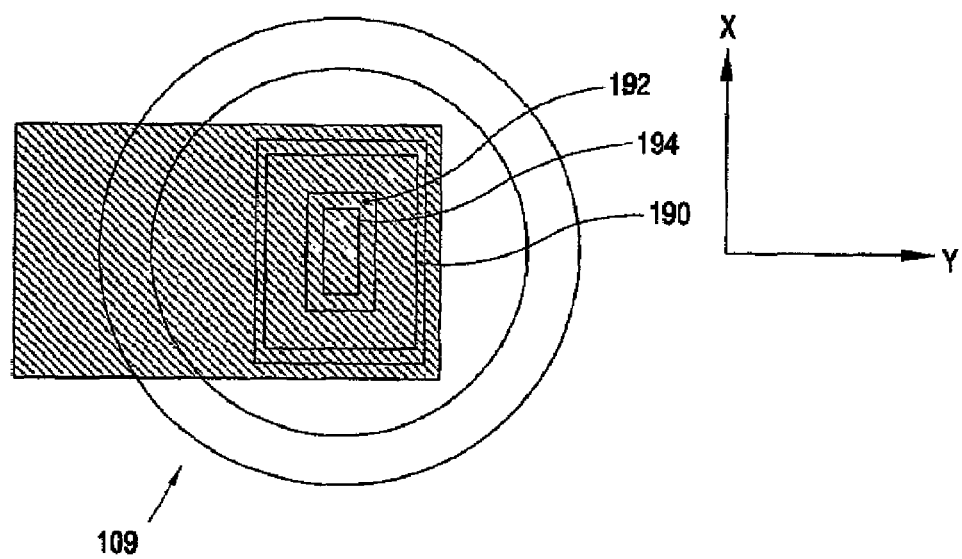
FIG. 5 is a schematic, bottom view along the line V-V in FIG. 4.

In FIGS. 4 and 5 a second example of a lens system 109 for devices such as the devices shown in FIGS. 1 and 6 is shown. According to this example, the outflow opening 190 downstream of the liquid supply canal 167 is also provided with a canal structure open towards the layer 5 (i.e. in the direction in which the beam 107 is directed), but has a different, rectangular shape when seen in axial direction of the lens system 109. An essentially rectangular shape is particularly advantageous for reliably immersing a rectangular area 194 of the interspace intersected by the radiation beam while maintaining a uniform liquid flow patter throughout the intersected portion 194 of the interspace 153, in particular if the movement of the lens system 109 and the layer 5 relative to each other is in a direction perpendicular to one of the sides of the rectangular canal structure 190. Such circumstances typically occur in optical projection lithography.

The recess 192 is bounded by a passage 195 in a wall 165 perpendicular to the axis of the lens system 9 and a surface of the lens 159 nearest to the spot 11 and the surface of the lens 159 nearest to the spot 11 also bounds the portion 194 of the interspace 153 through which the radiation 107 passes to the spot 11. Accordingly, the lens 159 is effectively protected against damage due to inadvertent contact between the lens system 109 and the layer 5 on the substrate 3.

The invention claimed is:

1. A method of irradiating a layer including:
    directing and focussing a radiation beam to a spot on said layer by means of at least one optical element;
    causing relative movement of the layer relative to said at least one optical element so that, successively, different portions of the layer are irradiated and an interspace between a surface of said at least one optical element nearest to said layer is maintained; and
    maintaining at least a portion of said interspace through which said radiation beam irradiates said spot on said layer filled with a liquid, the liquid being supplied via a supply conduit and flowing out of an outflow opening;
    wherein at least one outflow opening via which the liquid flows out is provided in the form of at least one canal open towards said layer, said canal distributing supplied liquid longitudinally along said canal and dispensing distributed liquid towards said layer, and
    wherein at least a portion of said liquid fills up a recess through which said radiation beam irradiates said spot, said recess including a concave portion of said surface of said at least one optical element nearest to said layer.

2. The method according to claim 1, wherein the canal or canals are positioned such that, seen in a direction perpendicular to said layer, the canals define a total cross-sectional area having a centre in said portion of said interspace through which the radiation irradiates the spot.

3. The method according to claim 1, wherein a smallest thickness of said interspace is maintained at 3-1500 µm.

4. The method according to claim 1, wherein the recess has a rim portion closest to said layer extending around said radiation irradiating said spot.

5. A device for directing radiation to a layer including:
    at least one optical element for focussing a beam of radiation originating from a radiation source to a spot on said layer;

a displacement structure for causing relative movement of the layer relative to said at least one optical element so that, successively, different portions of the layer are irradiated and an interspace between said layer and a surface of said at least one optical element nearest to said spot is maintained; and an outflow opening for supplying liquid to at least a portion of said interspace through which, in operation, said radiation irradiates said spot on said layer, said outflow opening having a total projected cross-sectional passage area in a plane perpendicular to an axis of said beam;

wherein the outflow opening is formed by at least one canal open towards said layer, for distributing supplied liquid longitudinally along said canal and dispensing distributed liquid towards said layer, and wherein a recess is provided in a surface facing said spot, an internal surface of said recess bounding at least said portion of said interspace through which said radiation irradiates said spot, said recess including a concave portion of said surface of said at least one optical element nearest to said spot.

6. The device according to claim 5, wherein the outflow opening or a plurality of the outflow openings are positioned such that, seen in a direction parallel to said axis of said beam, said total projected cross-sectional passage area has a centre in said portion of said interspace through which the radiation irradiates the spot.

7. The device according to claim 5, wherein said displacement structure and said recess are positioned and dimensioned for maintaining a smallest thickness of said interspace at 3-1500 μm.

8. The device according to claim 5, wherein said recess has a rim portion closest to said layer extending around said portion of said interspace through which, in operation, said radiation irradiates said spot.

* * * * *